United States Patent
Catabay et al.

(10) Patent No.: US 6,346,490 B1
(45) Date of Patent: Feb. 12, 2002

(54) PROCESS FOR TREATING DAMAGED SURFACES OF LOW K CARBON DOPED SILICON OXIDE DIELECTRIC MATERIAL AFTER PLASMA ETCHING AND PLASMA CLEANING STEPS

(75) Inventors: Wilbur G. Catabay, Saratoga; Wei-Jen Hsia, Sunnyvale; Alex Kabansky, Santa Clara, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/543,412

(22) Filed: Apr. 5, 2000

(51) Int. Cl.[7] .................. H01L 21/31; H01L 21/469
(52) U.S. Cl. .................. 438/795; 438/788; 438/789
(58) Field of Search ............................ 438/788, 789, 438/795, 759, 710

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |

(List continued on next page.)

FOREIGN PATENT DOCUMENTS

| | | | |
|---|---|---|---|
| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO99/41423 | 8/1999 | C23C/16/40 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$—Incorporated Silica Films for Interlayer Dielectric Application", 1999 Joint International Meeting, *Electrochemical Society Meeting Abstracts*, vol. 99–2, 1999, Abstract No. 746. No month.

(List continued on next page.)

*Primary Examiner*—John F. Niebling
*Assistant Examiner*—Alexander G. Ghyka
(74) *Attorney, Agent, or Firm*—John P. Taylor, Esq.

(57) ABSTRACT

Damaged surfaces of a low k carbon-containing silicon oxide dielectric material are treated with one or more carbon-containing gases, and in the absence of an oxidizing agent, to inhibit subsequent formation of silicon-hydroxyl bonds when the damaged surfaces of the low k dielectric material are thereafter exposed to moisture. The carbon-containing gas treatment of the invention is carried out after the step of oxidizing or "ashing" the resist mask to remove the mask, but prior to exposure of the damaged surfaces of the low k dielectric material to moisture. Optionally, the carbon-containing gas treatment may also be carried out after the initial step of etching the low k carbon-containing silicon oxide dielectric material to form vias or contact openings as well, particularly when exposure of the damaged surfaces of the low k dielectric material to moisture after the via etching step and prior to the resist removing oxidation step is possible. The treatment of the damaged low k carbon-containing silicon oxide dielectric material with a carbon-containing gas may be carried out with or without the assistance of a plasma, but preferably will be carried out in the presence of a plasma. An $N_2$ densification step may also be carried out after the via etch step and optional carbon-containing gas treatment, but prior to the resist removal oxidation step.

20 Claims, 1 Drawing Sheet

U.S. PATENT DOCUMENTS

| | | | |
|---|---|---|---|
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A * | 3/1999 | Bersin et al. | 204/192.35 |
| 5,904,154 A * | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,232,658 B1 | 5/2001 | Catabay et al. | 257/701 |

OTHER PUBLICATIONS

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

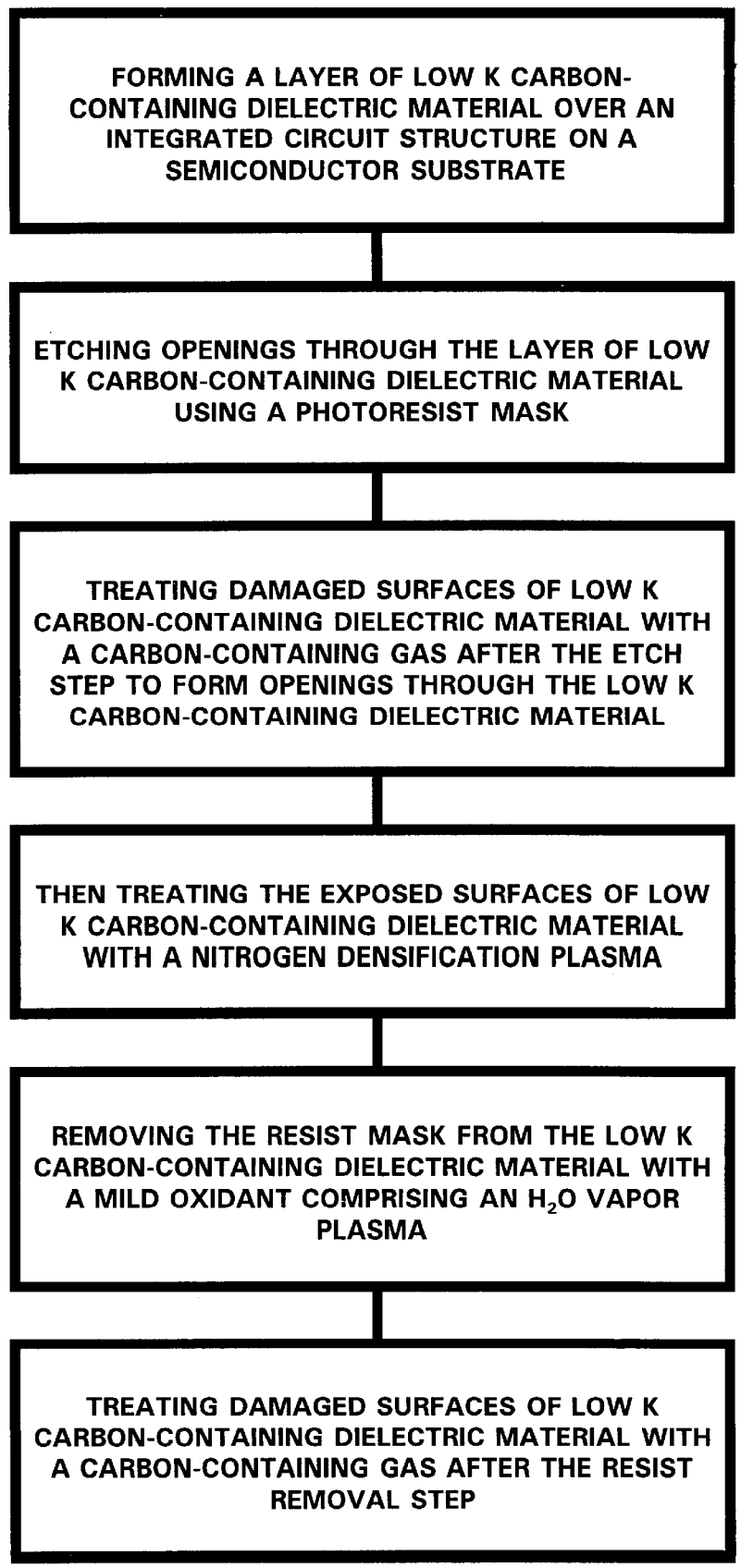

PROCESS FOR TREATING DAMAGED SURFACES OF LOW K CARBON DOPED SILICON OXIDE DIELECTRIC MATERIAL AFTER PLASMA ETCHING AND PLASMA CLEANING STEPS

BACKGROUND OF THE INVENTION

1. Field of the Invention

This invention relates to integrated circuit structures constructed on semiconductor substrates. More particularly, this invention relates to a process for treating damaged surfaces of low dielectric constant (k) carbon doped silicon oxide dielectric material prior to exposure to the atmosphere to inhibit subsequent moisture absorption by such damaged low k carbon doped silicon oxide dielectric material when exposed to the atmosphere.

2. Description of the Related Art

In the construction of integrated circuit structures, dielectric materials such as silicon oxide ($SiO_2$) have been conventionally used to electrically separate and isolate or insulate conductive elements of the integrated circuit structure from one another. However, as the spacing between such conductive elements in the integrated circuit structure have become smaller and smaller, the capacitance between such conductive elements through the silicon oxide dielectric has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by silicon oxide insulation, as the scale of integrated circuit structures continues to reduce, the use of other insulation materials having lower dielectric constants than conventional silicon oxide ($SiO_2$) has been proposed. One such material is a carbon doped (carbon-containing) silicon oxide material wherein at least a portion of the oxygen atoms bonded to the silicon atoms are replaced by carbon-containing organic groups. In its simplest form, such carbon-containing silicon oxide dielectric material may comprise a mono or dimethyl silicon oxide dielectric material, wherein at least a portion of the oxygen atoms bonded to the silicon atoms are replaced by methyl ($CH_3$-) groups. Such a methyl silicon oxide dielectric material has a dielectric constant (k) of about 2.9 and is, therefore, of great interest as a low k substitute for the conventional silicon oxide ($SiO_2$) insulation material, which has a k value of about 4.

Other such low k carbon-containing silicon oxide dielectric materials include the multiple carbon-containing silicon oxide dielectric materials described and claimed in copending U.S. patent application Ser. No. 09/274,457 now U.S. Pat. No. 6,303,047 entitled LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME, which was filed on Mar. 22, 1999, and assigned to the assignee of this invention, and the subject matter of which is hereby incorporated by reference.

While the substitution of one or more carbon-containing organic groups such as methyl groups, for some of the oxygen atoms bonded to the silicon atoms has a beneficial effect in the lowering of the dielectric constant of the low k carbon-containing silicon oxide dielectric material, therefore lowering the capacitance between conductive elements separated by such dielectric material, it has been found that the bond formed between the silicon atoms and the carbon-containing organic group is not as stable as the silicon-oxygen bond found in conventional silicon oxide ($SiO_2$) materials.

In particular, for example, when surfaces of such a low k carbon-containing silicon oxide dielectric layer are exposed to etchants used to form openings therein, or to oxidizing or "ashing" systems, which are used to remove a photoresist mask such as the typical photoresist mask made of organic material from the low k carbon-containing silicon oxide dielectric layer after formation of such openings therein, it has been found that the etching and oxidizing (ashing) processes can result in damage to the bonds (severance) between the organic moieties (e.g., such as methyl radicals), and the silicon atoms adjacent the surfaces of the low k carbon-containing silicon oxide dielectric layer exposed to such etching and/or oxidizing treatments.

The term "openings", as used herein, is intended to describe either vias formed through a dielectric layer between two layers of metal interconnects, or contact openings formed through a dielectric layer between devices on the substrate and a metal interconnect layer. This severance of the carbon-silicon bonds in the low k carbon-containing silicon oxide dielectric material, in turn, results in removal of such organic materials formerly bonded to the silicon atoms along with the organic photoresist materials being removed from the integrated circuit structure. The silicon atoms from which the organic radicals have been severed, and which are left in the damaged surface of the low k carbon-containing silicon oxide dielectric layer, have dangling bonds which are very reactive and become water absorption sites if and when the damaged surface is exposed to moisture.

This absorption of moisture by the damaged low k carbon-containing silicon oxide dielectric material, results in hydroxyl bonding to the dangling silicon bonds left from the severance of the carbon-silicon bonds in the damaged surface of the low k carbon-containing silicon oxide dielectric layer. This silicon-hydroxyl bond is not a stable bond and subsequent exposure to heat, e.g., during subsequent processing such as annealing, can result in severance of the silicon-hydroxyl bond, thereby causing water vapor formation which, for example, can interfere with subsequent filling of a via/contact opening or a damascene trench with metal filler material.

It would, therefore, be desirable to repair any damage done to the low k carbon-containing silicon oxide dielectric layer by the severance of the carbon-silicon bonds prior to any exposure of the damaged surface to moisture to thereby ensure against formation of unstable silicon-hydroxyl bonds in the damaged surface of the low k carbon-containing silicon oxide dielectric layer.

SUMMARY OF THE INVENTION

Damaged surfaces of a low k carbon-containing silicon oxide dielectric material are treated with one or more carbon-containing gases, and in the absence of an oxidizing agent, to inhibit subsequent formation of silicon-hydroxyl bonds when the damaged surfaces of the low k dielectric material are thereafter exposed to moisture. The carbon-containing gas treatment of the invention is carried out after the step of oxidizing or "ashing" the resist mask to remove the mask, but prior to exposure of the damaged surfaces of the low k dielectric material to moisture. Optionally, the carbon-containing gas treatment may also be carried out after the initial step of etching the low k carbon-containing silicon oxide dielectric material to form vias or contact openings as well, particularly when exposure of the damaged surfaces of the low k dielectric material to moisture after the via etching step and prior to the resist-removing oxidation step is possible. The treatment of the damaged low k carbon-containing silicon oxide dielectric material with a carbon-containing gas may be carried out with or without the assistance of a plasma, but preferably will be carried out in the presence of a plasma.

BRIEF DESCRIPTION OF THE DRAWINGS

The sole FIGURE is a flowsheet illustrating the process of the invention.

DETAILED DESCRIPTION OF THE INVENTION

The invention comprises the treatment of damaged surfaces of a low k carbon-containing silicon oxide dielectric material with one or more carbon-containing gases, and in the absence of an oxidizing agent, to inhibit subsequent formation of silicon-hydroxyl bonds when the damaged surfaces of the low k dielectric material are thereafter exposed to moisture. The carbon-containing gas treatment of the invention is carried out after the step of oxidizing or "ashing" the resist mask to remove the mask, but prior to exposure of the damaged surfaces of the low k dielectric material to moisture. Optionally, the carbon-containing gas treatment may also be carried out after the initial step of etching the low k carbon-containing silicon oxide dielectric material to form vias or contact openings as well, particularly when exposure of the damaged surfaces of the low k dielectric material to moisture after the via etching step and prior to the resist removing oxidation step is possible. The treatment of the damaged low k carbon-containing silicon oxide dielectric material with a carbon-containing gas may be carried out with or without the assistance of a plasma, but preferably will be carried out in the presence of a plasma.

By use of the interchangeable terms "low dielectric constant" or "low k" herein, with respect to the low dielectric constant (k) carbon-containing silicon oxide dielectric material being treated by the process of the invention, is meant a dielectric constant (k value) which is less than the dielectric constant of a conventional silicon oxide dielectric material which does not contain carbon. Preferably, the dielectric constant of the low k carbon-containing silicon oxide electric material being processed by the invention will be a value of 3 or less.

By use of the term "carbon-containing" herein, with respect to the low k carbon-containing silicon oxide dielectric material treated by the process of the invention, is meant a silicon oxide-containing material having one or more carbon-containing groups with one carbon atom in each carbon- containing group bonded to a silicon atom.

By way of illustration, and not of limitation, the one or more carbon-containing gases which may be used to treat the damage surfaces of the low k carbon-containing silicon oxide dielectric material include hydrocarbons which have the formula $C_xH_{(2x+2)}$, where x=1 to 10, such as, for example, $CH_4$, $C_2H_6$, $C_3H_8$, and $C_4H_{10}$. Also useful are fluorocarbons having the formula $C_xF_{(2x+2)}$, where x=1 to 6, and fluorinated hydrocarbons having the formula $C_xH_yF_z$, where x=1 to 6, y=1 to (2x+1), and z=(2x+2)−y. The carbon-containing gases may further include organo-substituted silanes such as methyl-substituted silanes having the formula $(CH_3)_xSiH_{(4-x)}$, where x is 1 to 4. Other organo-substituted silanes which may be used in the practice of the invention may be found in the aforementioned copending U.S. patent application Ser. No. 09/274,457. It must be noted, however, that the particular carbon-containing material selected must be in the gaseous state at the treatment temperature used, It is important to note that while use of carbon-containing gases such as some of the above in conjunction with oxidizing agent s such as $O_2$, is known, the treatment of the damaged surfaces of low k carbon-containing silicon oxide dielectric material in accordance with the invention must be carried out in the absence of such oxidizing agents.

The rate of flow of the carbon-containing gas into the chamber will vary with the size of the chamber as well as the operating pressure. Typically for a 5 liter chamber with an operating pressure of from about 1 Torr to about 3 Torr, the flow rate of carbon-containing gas or gases into the treatment chamber will range from about 5 standard cubic centimeters per minute (scam) to ab out 5000 sccm. The flow of carbon-containing gas into the chamber may be accompanied by flow of one or more non-reactive gases such as argon or helium, if desired. However, as previously mentioned, it is very important that no gases be present during the treatment step capable of oxidizing the exposed surfaces of low k carbon-containing silicon oxide dielectric material.

The treatment may be carried out either with or without the use of a plasma. When a plasma is used to assist the treatment, the plasma power will be maintained within a range of from about 500 watts to about 3,000 watts, and preferably from about 500 watts to about 2000 watts, with a power level of about 1,000 watts being typical. The rf power source may be the typical 13.56 MHz power source, although low frequency power, e.g., as low as 400 kHz, may also be used. The plasma may be used with or without a bias on the wafer (dual plasma mode or single plasma mode) and the plasma may be generated using any well known type of plasma generation technique, e.g., microwave, ICP, downstream microwave, rf RIE, etc.

The treatment may be carried out at a temperature ranging from about 25° C. up to about 450° C., and preferably ranging from about 25° C. up to about 300° C. The treatment temperature selected will be affected by the choice of carbon-containing treatment materials, since the carbon-containing agent must be a gas at the treatment temperature. The pressure used for the treatment will range from about 5 millitorr up to as high as about 10 Torr. Preferably, the pressure will range from about 1 to about 3 Torr.

The treatment time will vary with the temperature selected, the pressure used, and the presence or absence of a plasma. The treatment time may vary from as little as 30 seconds up to about 6 minutes, with a 3 minute treatment time being typical. Longer treatment times may be used, but are not preferred due to process economics, as well as conservation of thermal budget when elevated temperatures are used.

While the treatment may be carried out only after the oxidizing step to remove the resist mask, such as an organic resist mask, it is very important that the treatment of the invention be carried out prior to exposure of the damaged surfaces of the low k carbon-containing silicon oxide dielectric material to moisture. Therefore, if the damaged surfaces of the low k material will be exposed to moisture after initial formation of the vias or contact openings, and prior to the oxidizing step to remove the resist mask, the treatment of the invention should be carried out after the etch step (and prior to such moisture exposure). Then, after removal of the resist mask, the treatment should be again applied to the redamaged surfaces of the low k carbon-doped silicon oxide dielectric material prior to further exposure of the redamaged surfaces to moisture. It should be noted in this regard, that even when exposure of the damaged surfaces of the low k dielectric material to moisture after the via etch step and prior to the resist removal oxidation step is not contemplated, treatment of the etch-damaged surfaces of the low k material prior to the resist-removing oxidation step may impart some additional benefit by enriching the damaged surfaces with carbon prior to the resist removal oxidation step. It is, therefore, preferred to apply the carbon gas treatment of the invention to the exposed surfaces of the low k carbon-containing silicon oxide dielectric material after both the via etching step and the later resist removal oxidation step.

In this regard, while we do not wish to be bound by any theories as to how the treatment of the damaged low k dielectric surfaces with one or more carbon-containing gases operates, i.e., whether or not the carbon in the one or more carbon-containing gases bonds with the silicon, it appears that the carbon in the carbon-containing gases is somehow incorporated into the damaged surface of the low k carbon-containing silicon oxide dielectric material in a manner which inhibits subsequent formation of silicon-hydroxyl bonds when the damaged surfaces of the low k dielectric material are thereafter exposed to moisture.

The treatment of the damaged low k carbon-containing silicon oxide dielectric material with the one or more carbon-containing gases may be carried out in any chamber which is sealed from the atmosphere to thereby exclude moisture. Preferably the carbon-containing gas treatment process of the invention will be carried out in the same chamber as used for the prior step which caused the damage to the surfaces of the low k dielectric material to ensure that no exposure to moisture occurs between the step causing the damage and the carbon-containing gas treatment step of the invention. Thus, if the carbon-containing gas treatment step of the invention is used after the via etch step, the carbon-containing gas treatment step will preferably be applied to the damaged surfaces of the low k dielectric material in the etch chamber. Likewise, the treatment step with carbon-containing gas after the resist removal oxidizing step will preferably be carried out in the same oxidation chamber used to remove the resist mask to ensure that there will be no intervening exposure to moisture after the damage to the exposed low k surfaces caused by the resist removal oxidation step.

However, when the carbon treatment of the invention cannot be carried out in the same chamber used for either the prior via etching step or the prior resist removal oxidation step which cause the damage to be treated, it is very important that the substrate having the damaged surface of low k dielectric material thereon be transported under moisture-free conditions (such as a gas tight container) from the etch chamber (or oxidation chamber) to the chamber in which the carbon-containing gas treatment will be carried out.

The process of the invention may be carried out in conjunction with other processes designed to mitigate damage to exposed surfaces of low k carbon-containing silicon oxide dielectric material. Such a process is described and claimed in U.S. Pat. No. 6,114,259 issued on Sep. 5, 2000 from copending U.S. patent application Ser. No. 09/362,645 entitled "PROCESS FOR TREATING EXPOSED SURFACES OF A LOW DIELECTRIC CONSTANT CARBON DOPED SILICON OXIDE DIELECTRIC MATERIAL TO PROTECT THE MATERIAL FROM DAMAGE", which was filed on Jul. 27, 1999, and assigned to the assignee of this invention, and the subject matter of which is hereby incorporated by reference. In that process, the exposed surfaces of low k carbon-containing silicon oxide dielectric material are treated, prior to the resist removal oxidation step, with a plasma such as an $N_2$ plasma capable of forming a densified protection layer on the exposed surfaces of the low k carbon-containing silicon oxide dielectric material A subsequent resist removal step described and claimed in the aforesaid U.S. Pat. No. 6,114,259 comprises the use of a mild oxidizing agent such as an $H_2O$ vapor plasma capable of removing the resist mask.

The following will serve to further illustrate the invention:

A 600 nm thick layer of the same low k carbon-containing silicon oxide dielectric material can be identically applied to five silicon wafers, over the same integrated circuit structure previously formed thereon. Identical photoresist masks can then be formed over the low k dielectric layer on each of the five wafers. Openings (vias) are then etched through the layer of low k dielectric material on each wafer, using a convention $Ar/C_4H_8/O_2N_2$ via etch process.

After the via etch step, the exposed surfaces of low k carbon-containing silicon oxide dielectric material on two of the wafers (wafers 4 & 5) may be treated with carbon-containing gas, in accordance with the invention, in the via etch chamber (without removal of the respective wafers from the etch chamber) by flowing 1000 sccm of 88 vol. % $N_2$/12 vol. % $CH_4$ into the chamber, while maintaining a pressure of 1 Torr and a temperature of 100° C. A plasma is then ignited in the chamber during the treatment and maintained at a power level of 1000 watts during the treatment. After about 2 minutes, the flow of carbon-containing gas into the chamber will be shut off and the plasma is extinguished.

One of the wafers not treated by this first carbon-containing gas treatment step of the invention (wafer 3) and one of the wafers treated with the carbon-containing gas step (wafer 5) are both then subjected to an $N_2$ densification step in the etch chamber by flowing 12 sccm of $N_2$ into the chamber while a pressure of 300 millitorr and a temperature of 10° C. is maintained. A plasma is ignited and maintained at 500 watts for 2.5 minutes after which the flow of $N_2$ gas is shutoff and the plasma is extinguished.

All five wafers are then removed from the etch chamber and transported to a resist removal ashing chamber, where each wafer is then subject to a mild oxidation step to remove the resist mask using an $H_2O$ vapor plasma, comprising an $N_2/H_2O$ plasma with an $N_2$ flow of 20 sccm and an $H_2O$ flow of 100 sccm. The plasma is maintained at a power level of 550 watts, while the chamber is maintained at a temperature of 10° C., and at a pressure of 300 millitorr. The resist removal step is carried out until all of the resist has been removed, an empirically ascertainable time.

All of the wafers (wafers 2–5) except the control wafer (wafer 1) are then subject to treatment in the oxidation chamber (without exposure of any of the wafers to moisture after the resist removal step) with a carbon-containing gas treatment step as described above for wafers 4 and 5.

To ascertain the moisture resistance of each of the exposed surfaces of low k carbon-containing silicon oxide dielectric material, each of the wafers may be physically examined for defective metal deposition vias by visual inspection using a 50×–100× microscope. Alternatively, a pattern recognition defect inspection system, such as commercially available from KLA, can be programmed to recognize unfilled vias. When such an inspection is carried out, the wafers treated as identifed should be found to rank in order of defective metal filling as shown in the following table:

TABLE

| Wafer No. | Types of Treatments | Ranking of Defective Metal-filled Vias |
|---|---|---|
| 1 | None (Control) | Poor ↓ |
| 2 | Carbon-containing gas only after resist removal | Better ↓ |
| 3 | $N_2$ Densification after via etch, carbon-containing gas after resist removal | Better ↓ |
| 4 | Carbon-containing gas after via etch and after resist removal (No densification) | Better ↓ |
| 5 | Carbon-containing gas after via etch, then $N_2$ densification after via etch, carbon-containing gas after resist removal | Best |

The results indicate that damage to the low k carbon-containing silicon oxide dielectric material can be mitigated by the process of the invention, and further that such mitigation can be optimized by treating the damaged surfaces with the carbon-containing gas both after the via etch step and the resist removal, and that further improvement may be obtained by combining the carbon-containing gas steps of the invention with $N_2$ densification of the exposed surfaces of the low k carbon-containing silicon oxide dielectric material prior to the resist removal oxidation step.

Thus, the invention provides a process wherein surfaces of low k carbon-containing silicon oxide dielectric material damaged by either the via etch process or the resist removal oxidation process, or both, may be successfully treated to alleviate such damage sufficiently to permit successful subsequent filling of vias and contact openings with metal to form low resistance electrical connections between conductive elements below and above the layer of low k carbon-containing silicon oxide dielectric material.

Having thus described the invention what is claimed is:

1. A process for treating damaged surfaces of a low k carbon-containing silicon oxide dielectric material of an integrated circuit structure on a semiconductor substrate after the etching of openings in said low k carbon-containing silicon oxide dielectric material through a photoresist mask comprises:
   a) oxidizing said photoresist mask on said low k carbon-containing silicon oxide dielectric material to remove said photoresist mask; and
   b) then treating said damaged surfaces of low k carbon-containing silicon oxide dielectric material with one or more carbon-containing gases at a pressure of from about 1 torr to about 10 torr, and in the absence of an oxidizing agent, to repair said damage to such surfaces of said low k carbon-containing silicon oxide dielectric material by said step of oxidizing said photoresist mask.

2. The process of claim 1 wherein said treatment of said damaged low k carbon-containing silicon oxide dielectric material is carried out under conditions which will inhibit subsequent formation of silicon-hydroxyl bonds when said damaged surfaces of the low k dielectric material are thereafter exposed to moisture.

3. The process of claim 1 wherein said treatment of said damaged surfaces of said low k carbon-containing silicon oxide dielectric material with a carbon-containing gas is carried out for a period of from about 30 seconds to about 6 minutes.

4. The process of claim 1 wherein said treatment of said damaged surfaces of said low k carbon-containing silicon oxide dielectric material with a carbon-containing gas is carried out at a temperature of from about 25° C. to about 450° C.

5. The process of claim 1 wherein said treatment of said damaged surfaces of said low k carbon-containing silicon oxide dielectric material with a carbon-containing gas is carried out with a plasma maintained at a power level ranging from about 500 watts to about 3,000 watts.

6. The process of claim 1 wherein said treatment of said damaged surfaces of said low k carbon-containing silicon oxide dielectric material with one or more carbon-containing gases is carried out using a carbon-containing material capable of existing in a gaseous state at the treatment temperature selected from the group consisting of:
   a) a hydrocarbon having the formula $C_xH_{(2x+2)}$, where x=1 to 10; and
   b) an organo-substituted silane.

7. The process of claim 1 wherein said treatment of said damaged surfaces of said low k carbon-containing silicon oxide dielectric material with one or more carbon-containing gases is also carried out after said etching openings through said low k carbon-containing silicon oxide dielectric material using said photoresist mask, but before said step of oxidizing said photoresist mask on said low k carbon-containing silicon oxide dielectric material to remove said photoresist mask.

8. The process of claim 1 wherein an $N_2$ densification step is carried out after said etching of openings in said low k carbon-containing silicon oxide dielectric material through said photoresist mask, but prior to said resist removal oxidation step.

9. A process for treating damaged surfaces of a low k carbon-containing silicon oxide dielectric material of an integrated circuit structure on a semiconductor substrate comprises:
   a) forming a layer of said low k carbon-containing silicon oxide dielectric material over said integrated circuit structure on said semiconductor substrate;
   b) forming a resist mask comprising an organic material over said layer of low k carbon-containing silicon oxide dielectric material;
   c) etching openings through said layer of low k carbon-containing silicon oxide dielectric material using said resist mask;
   d) removing said resist mask; and
   e) treating exposed surfaces of said low k carbon-containing silicon oxide dielectric material with one or more carbon-containing gases selected from the group consisting of:
      i) a hydrocarbon having the formula $C_xH_{(2x+2)}$, where x=1 to 10; and
      ii) an organo-substituted silane,
      to treat damage to such exposed surfaces of low k carbon-containing silicon oxide dielectric material by said step of removing said resist mask.

10. The process for treating damaged surfaces of a low k carbon-containing silicon oxide dielectric material of claim 9 which further comprises also treating exposed surfaces of said low k carbon-containing silicon oxide dielectric material with one or more carbon-containing gases after said step of forming said openings in said low k carbon-containing silicon oxide dielectric material, but prior to said step of removing said resist mask, to thereby treat damage to such exposed surfaces of low k carbon-containing silicon oxide dielectric material caused by said step of etching said openings through said low k carbon-containing silicon oxide dielectric material.

11. The process for treating damaged surfaces of a low k carbon-containing silicon oxide dielectric material of claim 9 which further comprises an $N_2$ densification step carried out after said etch step through said resist mask to form said openings in said low k carbon-containing silicon oxide dielectric material, but prior to said resist removal oxidation step.

12. The process of claim 11 wherein a further step of treating exposed surfaces of said low k carbon-containing silicon oxide dielectric material with one or more carbon-containing gases is carried out after said step of forming said openings in said low k carbon-containing silicon oxide dielectric material but prior to said $N_2$ densification step.

13. The process of claim 9 wherein said treatment of said damaged surfaces of said low k carbon-containing silicon oxide dielectric material with a carbon-containing gas is carried out for a period of from about 30 seconds to about 6 minutes.

14. The process of claim 9 wherein said treatment of said damaged surfaces of said low k carbon-containing silicon oxide dielectric material with a carbon-containing gas is carried out at a pressure of from about 1 torr to about 10 torr.

15. The process of claim 9 wherein said treatment of said damaged surfaces of said low k carbon-containing silicon oxide dielectric material with a carbon-containing gas is carried out at a temperature of from about 25° C. to about 450° C.

16. The process of claim 9 wherein said treatment of said damaged surfaces of said low k carbon-containing silicon oxide dielectric material with a carbon-containing gas is carried out with a plasma maintained at a power level ranging from about 500 watts to about 3,000 watts.

17. A process for treating damaged surfaces of a low k carbon-containing silicon oxide dielectric material of an integrated circuit structure on a semiconductor substrate comprises:

a) forming a layer of said low k carbon-containing silicon oxide dielectric material over said integrated circuit structure on said semiconductor substrate;

b) forming a resist mask comprising an organic material over said layer of low k carbon-containing silicon oxide dielectric material;

c) etching openings through said layer of low k carbon-containing silicon oxide dielectric material using said resist mask;

d) treating exposed surfaces of said low k carbon-containing silicon oxide dielectric material with one or more carbon-containing gases in a plasma maintained at a power level ranging from about 500 watts to about 3,000 watts, to treat damage to such exposed surfaces by said step of etching openings through said layer of low k carbon-containing silicon oxide dielectric material;

e) removing said resist mask; and f) treating exposed surfaces of said low k carbon-containing silicon oxide dielectric material with one or more carbon-containing gases in a plasma maintained at a power level ranging from about 500 watts to about 3,000 watts, to treat damage to such exposed surfaces of low k carbon-containing silicon oxide dielectric material by said step of removing said resist mask.

18. The process of claim 17 which further includes an $N_2$ densification step carried out after said step of treating exposed surfaces of said low k carbon-containing silicon oxide dielectric material with one or more carbon-containing gases to treat damage to such exposed surfaces by said step of etching openings through said layer of low k carbon-containing silicon oxide dielectric material, but prior to said resist removal step.

19. The process of claim 17 wherein said step of removing said resist mask is carried out using an $H_2O$ vapor plasma.

20. The process of claim 17 wherein said treatment of said damaged surfaces of said low k carbon-containing silicon oxide dielectric material with one or more carbon-containing gases is carried out using a carbon-containing material capable of existing in a gaseous state at the treatment temperature selected from the group consisting of:

a) a hydrocarbon having the formula $C_xH_{(2x+2)}$, where x=1 to 10; and b) an organo-substituted silane.

* * * * *